United States Patent
Kondo et al.

(10) Patent No.: US 8,883,913 B2
(45) Date of Patent: *Nov. 11, 2014

(54) RESIN COMPOSITION, RESIN FILM, SEMICONDUCTOR DEVICE, AND PRODUCTION METHOD THEREOF

(71) Applicant: Shin-Etsu Chemical Co., Ltd., Tokyo (JP)

(72) Inventors: Kazunori Kondo, Annaka (JP); Michihiro Sugo, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 95 days.

This patent is subject to a terminal disclaimer.

(21) Appl. No.: 13/669,541

(22) Filed: Nov. 6, 2012

(65) Prior Publication Data

US 2013/0113083 A1    May 9, 2013

(30) Foreign Application Priority Data

Nov. 7, 2011    (JP) .................................. 2011-243359

(51) Int. Cl.
| | | |
|---|---|---|
| C08K 3/36 | (2006.01) | |
| H01L 23/29 | (2006.01) | |
| C08L 83/14 | (2006.01) | |
| H01L 23/28 | (2006.01) | |
| H01L 21/78 | (2006.01) | |
| C09D 183/14 | (2006.01) | |

(52) U.S. Cl.
CPC ............... *C08L 83/14* (2013.01); *H01L 23/296* (2013.01); *H01L 23/28* (2013.01); *H01L 21/78* (2013.01); *C09D 183/14* (2013.01)
USPC .............................. 524/588; 528/35; 525/476

(58) Field of Classification Search
USPC .............. 525/476; 524/588; 528/35; 428/447
See application file for complete search history.

(56) References Cited

U.S. PATENT DOCUMENTS

| | | | |
|---|---|---|---|
| 3,159,601 A | 12/1964 | Ashby | |
| 3,159,662 A | 12/1964 | Ashby | |
| 3,220,972 A | 11/1965 | Lamoreaux | |
| 3,775,452 A | 11/1973 | Karstedt | |
| 3,882,083 A * | 5/1975 | Berger et al. | 528/15 |
| 5,101,029 A * | 3/1992 | Stapp et al. | 544/221 |
| 8,124,715 B2 * | 2/2012 | Tanaka et al. | 528/32 |
| 2011/0037174 A1 * | 2/2011 | Nikaido et al. | 257/737 |
| 2011/0105646 A1 | 5/2011 | Kan et al. | |
| 2011/0262697 A1 * | 10/2011 | Katsurayama et al. | 428/131 |

FOREIGN PATENT DOCUMENTS

| | | | |
|---|---|---|---|
| JP | 2008-143954 | * | 6/2008 |
| JP | 2008150506 | * | 7/2008 |
| WO | WO 2009/142065 A1 | | 11/2009 |

* cited by examiner

*Primary Examiner* — Margaret Moore
(74) *Attorney, Agent, or Firm* — Birch, Stewart, Kolasch & Birch, LLP

(57) ABSTRACT

A resin composition which can be formed into a film for use in molding a large diameter thin film wafer is provided. The composition comprises components (A) a silicone resin containing repeating units represented by the following formulae (1-1), (1-2), and (1-3) and having a weight average molecular weight as measured by GPC in terms of polystyrene of 3,000 to 500,000,

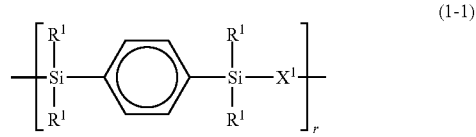
(1-1)

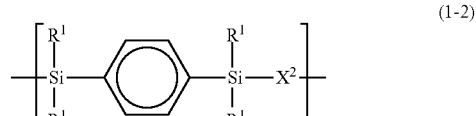

(1-2)

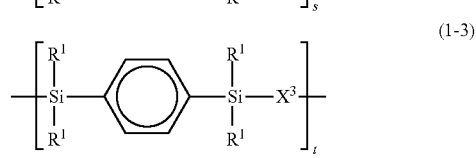

(1-3)

wherein r, s, and t are independently a positive integer; the silicon atom at the terminal of the units constituting the repeating units represented by the formulae (1-1), (1-2), and (1-3) is bonded to the terminal carbon atom of the $X^1$, $X^2$, or $X^3$ in the same or different unit; $R^1$ is independently a monovalent hydrocarbon group containing 1 to 8 carbon atoms; $X^1$, $X^2$, and $X^3$ are independently a divalent group; (B) a thermosetting resin; and (C) a filler.

10 Claims, No Drawings

RESIN COMPOSITION, RESIN FILM, SEMICONDUCTOR DEVICE, AND PRODUCTION METHOD THEREOF

CROSS-REFERENCE TO RELATED APPLICATION

This non-provisional application claims priority under 35 U.S.C. §119 (a) on Patent Application No. 2011-243359 filed in Japan on Nov. 7, 2011, the entire contents of which are hereby incorporated by reference.

TECHNICAL FIELD

This invention relates to a resin composition and a resin film. This invention also relates to a semiconductor device produced by using such resin film and its production method.

BACKGROUND ART

Recently, wafers used in the production of a semiconductor device have increased diameter and reduced thickness, and there is a high demand for a technology capable of sealing these wafers at the wafer level. In view of such situation, press molding using a liquid type epoxy resin has been proposed in addition to transfer molding using conventional liquid type epoxy resins (WO 2009/142065). However, the resin transfer molding is associated with the risk of wire deformation since the resin should pass through narrow channel, and the resin transfer molding is also associated with the risk of insufficient filling due to the increased sealing area. On the other hand, the press molding is associated with the difficulty of precise control of the press area at the wafer edge, and difficulty of optimizing flowability and physical properties in introducing the liquid sealing resin to the press. In addition, recent increase in the wafer diameter and decrease in wafer thickness generated the problem of wafer warpage after the molding which was not so much a problem in the conventional wafer, and good wafer protection is also required. In view of such situation, there is a strong demand for a wafer molding material which can simultaneously mold a wafer without causing problems such as filling failure of wafer surface, and which exhibits reduced warpage and good wafer protection after the molding.

SUMMARY OF INVENTION

Technical Problem

The present invention was completed for the purpose of solving the problems as described above, and an object of the present invention is to provide a film composition and a resin film which is capable of conducting simultaneous molding (wafer molding), and in particular, which exhibits good moldability for a thin film wafer having a large diameter, which realizes low warpage and good wafer protecting performance after the molding, which enables favorable molding process, and which is well suited for use in wafer level packaging. Another object of the present invention is to provide a resin film, a semiconductor device molded with such resin film, and a method for producing such semiconductor device.

Solution to Problem

In order to solve the problems as described above, the present invention provides a resin composition containing a silicone resin having a particular structure, a thermosetting resin, and a filler. This invention also provides a resin film.

More specifically, there has been a demand for a wafer molding material which can be used for the simultaneous wafer molding without causing the problem of insufficient filling to the wafer surface and which exhibits strong adhesion, low warpage, and good wafer protection after the molding. The inventors of the present invention have made an intensive study to solve the problem as described above, and found that a silicone resin having a particular structure provides a resin composition exhibiting strong adhesion to the wafer as well as excellent warpage resistance to the wafer after curing, and that the resin film prepared from the resin composition comprising such components will be a wafer molding material simultaneously exhibiting strong adhesion to the wafer and high wafer protection since the thermosetting resin provides adhesion to the wafer and wafer protection, and the filler improves the wafer protection and reliability of the resin composition after the curing. The present invention has been completed on the bases of such findings.

Accordingly, the present invention provides resin composition comprising the following components (A), (B), and (C):

(A) a silicone resin containing repeating units represented by the following formulae (1-1), (1-2), and (1-3) and having a weight average molecular weight as measured by GPC in terms of polystyrene using tetrahydrofuran for elution solvent of 3,000 to 500,000,

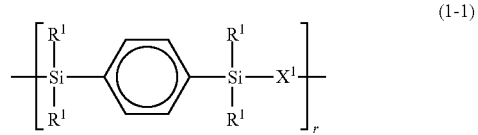

(1-1)

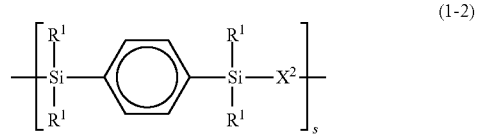

(1-2)

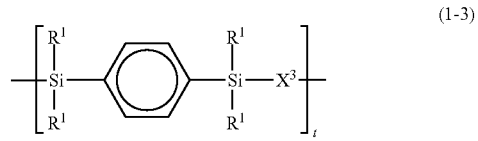

(1-3)

wherein r, s, and t are independently a positive integer; the silicon atom at the terminal of the units constituting the repeating units represented by the formulae (1-1), (1-2), and (1-3) is bonded to the terminal carbon atom of the $X^1$, $X^2$, or $X^3$ in the same or different unit; $R^1$ is independently a monovalent hydrocarbon group containing 1 to 8 carbon atoms; $X^1$ is independently a divalent group represented by the following formula (2):

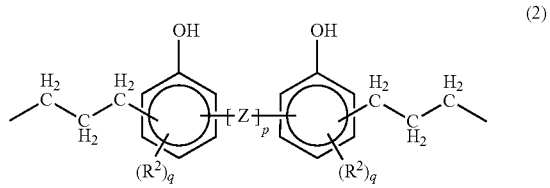

(2)

wherein Z is a substituted or unsubstituted divalent hydrocarbon group containing 1 to 15 carbon atoms, and p is 0 or 1, $R^2$ is independently an alkyl group or an alkoxy group containing 1 to 4 carbon atoms, and q is 0, 1, or 2; $X^2$ is independently a divalent group represented by the following formula (3):

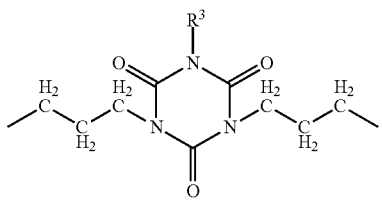
(3)

wherein $R^3$ is hydrogen atom, monovalent hydrocarbon group containing 1 to 8 carbon atoms, or a glycidyl group; and $X^3$ is independently a divalent group represented by the formula (4):

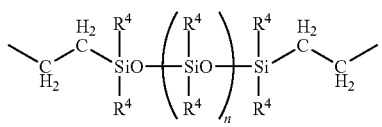
(4)

wherein $R^4$ is independently a monovalent hydrocarbon group containing 1 to 8 carbon atoms, and n an integer of 0 to 100;

(B) a thermosetting resin; and (C) a filler.

In the formula (2), Z is preferably a group selected from:

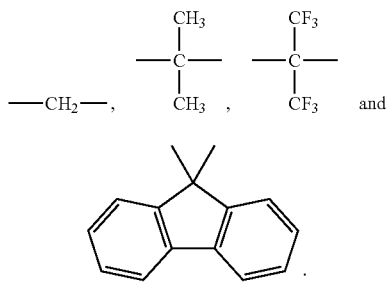

The component (A) may also comprise at least one unit selected from the unit represented by the following formula (5), the unit represented by the following formula (6), and the unit represented by the following formula (7):

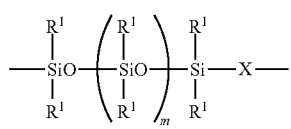
(5)

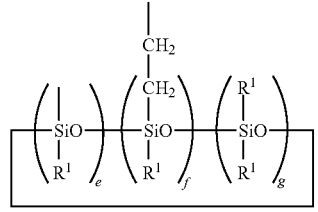
(6)

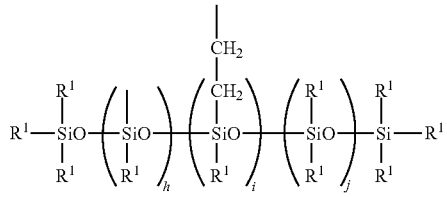
(7)

wherein $R^1$ is independently a monovalent hydrocarbon group containing 1 to 8 carbon atoms, m is an integer of 0 to 100, e, f, g, h, i and j are an integer of 0 to 100 with the proviso that e+f+g≥3, e and f are not simultaneously 0, and h and i are not simultaneously. X is independently a group represented by the $X^1$, $X^2$, or $X^3$, and the silicon atom at the terminal of the units constituting the repeating unit represented by the formulae (1-1), (1-2), and (1-3) and the units represented by the formulae (5), (6) and (7) is bonded to the terminal carbon atom of the same or different units.

Preferably, the amount of the component (B) is 5 to 100 parts by weight in relation to 100 parts by weight of the component (A), and the weight ratio of the component (C) in relation to the entire weight is 30 to 85% by weight.

The resin composition can be formed in the shape of a film, and therefore, it can be used for the simultaneous molding of wafers at once (wafer molding). Moreover the resin composition is well adapted for use in the wafer level packaging since it exhibits high molding ability, strong adhesion, reduced warpage, high wafer protection, and high reliability when used for a large diameter thin film wafer.

The silicone resin as described above have realized such effects, and in particular, this silicone resin reliably realizes adhesion and low warpage.

The thermosetting resin (B) is preferably an epoxy resin, and if desired, the epoxy resin may be incorporated with an epoxy resin curing agent and/or an epoxy resin curing aid. Use of an epoxy resin for the thermosetting resin enables stronger adhesion to the wafer as well as higher protection of the wafer. The filler is preferably silica.

The resin composition may be formed into a resin film, and the resin film may have a thickness of at least 100 μm and up to 700 μm.

A molding material having a thickness in such range has an improved warpage resistance.

The present invention also provides a method for producing a semiconductor device comprising the steps of attaching the thus obtained resin film to a semiconductor wafer to mold the semiconductor wafer, and singulating the molded semiconductor wafer.

The semiconductor wafer molded by using the resin film as described above is sufficiently protected, and the wafer exhibits reduced warpage. Accordingly, singulation of such semiconductor wafer enables production of the high quality semiconductor device at high yield.

The present invention also provides a semiconductor device which has a heat cured film. This semiconductor device is produced by singulating a semiconductor wafer molded with a heat cured film prepared by heat curing the resin film.

Accordingly, the semiconductor device which has a heat cured film prepared by heat curing the resin film is a sufficiently protected wafer exhibiting reduced warpage, and the semiconductor device produced by singulating such wafer is a high quality semiconductor device produced at a high yield.

Advantageous Effects of Invention

The resin composition of the present invention can be formed into a film shape, and accordingly, this resin composition is highly adapted for use in molding a thin film wafer with a large diameter. Since this resin composition enables strong adhesion, low warpage, high wafer protection, and molding of the wafer at once before the wafer dicing, the resin film produced from this resin composition is well suited for use in wafer level packaging.

The semiconductor device and its production method of the present invention is capable of providing a high quality semiconductor device at high yield.

DESCRIPTION OF EMBODIMENTS

Next, the resin composition of the present invention, the resin film and the semiconductor device obtained by using such resin composition, and their production method are described in detail, which by no means limit the scope of the present invention.

The resin composition of the present invention comprises
(A) silicone resin,
(B) thermosetting resin, and
(C) filler.
(A) Silicone Resin In the present invention, the silicone resin of the component (A) functions as a component enabling the film formation.

When the resulting resin film is used as a material for molding a wafer, this component realizes adhesion to the wafer, low warpage, and high moldability.

The silicone resin of the component (A) is a polymer containing repeating units represented by the following formulae (1-1), (1-2), and (1-3) and having a weight average molecular weight as measured by GPC in terms of polystyrene using tetrahydrofuran for elution solvent of 3,000 to 500,000, and preferably 5,000 to 200,000.

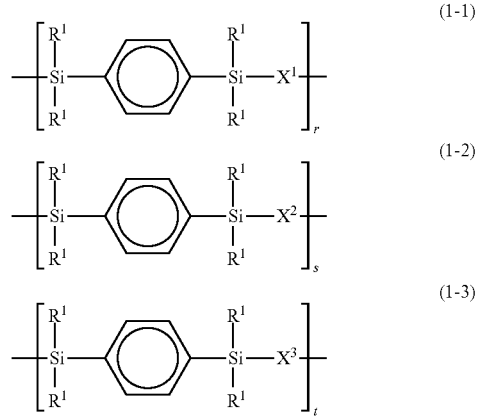

wherein r, s, and t are independently a positive integer; the silicon atom at the terminal of the units constituting the repeating units represented by the formulae (1-1), (1-2), and (1-3) is bonded to the terminal carbon atom of the $X^1$, $X^2$, or $X^3$ in the same or different unit; $R^1$ is independently a monovalent hydrocarbon group containing 1 to 8 carbon atoms; $X^1$ is independently a divalent group represented by the following formula (2):

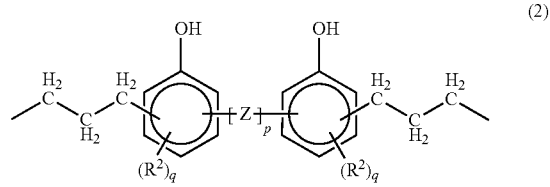

wherein Z is a substituted or unsubstituted divalent hydrocarbon group containing 1 to 15 carbon atoms, and p is 0 or 1, $R^2$ is independently an alkyl group or an alkoxy group containing 1 to 4 carbon atoms, and q is 0, 1, or 2; $X^2$ is independently a divalent group represented by the following formula (3):

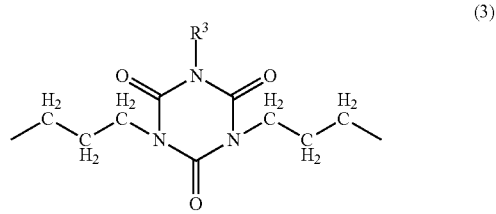

wherein $R^3$ is hydrogen atom, monovalent hydrocarbon group containing 1 to 8 carbon atoms, or a glycidyl group; and $X^3$ is independently a divalent group represented by the formula (4):

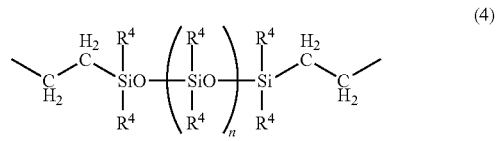

wherein $R^4$ is independently a monovalent hydrocarbon group containing 1 to 8 carbon atoms, and n an integer of 0 to 100.

In the formulae (1-1), (1-2), and (1-3), r, s, and t are number of the units constituting the repeating unit represented by the formulae (1-1), (1-2), and (1-3). More specifically, r, s, and t are a positive integer which results in the weight average molecular weight of the polymer of 3,000 to 500,000, and 5,000 to 200,000. Preferably, r, s, and t are integers satisfying $0.05 \leq r/(r+s+t) \leq 0.8$, $0.1 \leq s/(r+s+t) \leq 0.7$, and $0.05 \leq t/(r+s+t) \leq 0.8$, and more preferably, integers satisfying $0.1 \leq r/(r+s+t) \leq 0.6$, $0.2 \leq s/(r+s+t) \leq 0.5$, and $0.1 \leq t/(r+s+t) \leq 0.7$. The terminal silicon atom of the unit constituting the repeating units represented by the formulae (1-1), (1-2), and (1-3) may be bonded to the terminal carbon atom of the $X^1$, $X^2$ or $X^3$ of the same or different unit. The units may be bonded randomly or as a block polymer.

In the formula as described above, $R^1$ is independently a monovalent hydrocarbon group containing 1 to 8, and preferably 1 to 6, and examples include methyl group, ethyl group, propyl group, hexyl group, cyclohexyl group, and phenyl group. The preferred are methyl group and phenyl group in view of the availability of the starting material.

In the formula (2), $R^2$ is independently an alkyl group or an alkoxy group containing 1 to 4, and preferably 1 to 2 carbon atoms, and examples include methyl group, ethyl group, propyl group, tert-butyl group, methoxy group, and ethoxy group. Letter q is 0, 1, or 2, and preferably 0.

In the formula (2), Z is a substituted or unsubstituted divalent hydrocarbon group containing 1 to 15 carbon atoms, and the hydrogen atoms bonded to the carbon atom may be entirely or partly substituted with a halogen atom such as fluorine atom, chlorine atom, or bromine atom. Preferably, Z is a divalent group selected from the following groups:

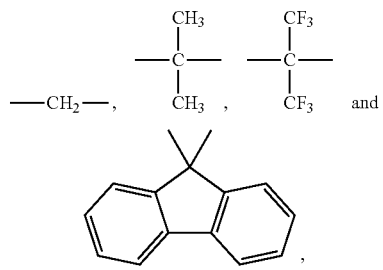

and p is 0 or 1.

In the formula (3), $R^3$ is hydrogen atom, a monovalent hydrocarbon group containing 1 to 8, and preferably 1 to 3 carbon atoms, or glycidyl group. Examples of the monovalent hydrocarbon group include methyl group, ethyl group, propyl group, and cyclohexyl group.

In the formula (4), $R^4$ is independently a monovalent hydrocarbon group containing 1 to 8, and preferably 1 to 6, and examples include methyl group, ethyl group, propyl group, hexyl group, cyclohexyl group, and phenyl group. Among these, the preferred are methyl group and phenyl group in view of the availability of the starting material, and n is an integer of 0 to 100, and preferably 0 to 60.

The polymer containing the repeating units represented by the formulae (1-1), (1-2), and (1-3) may be represented by the following formula:

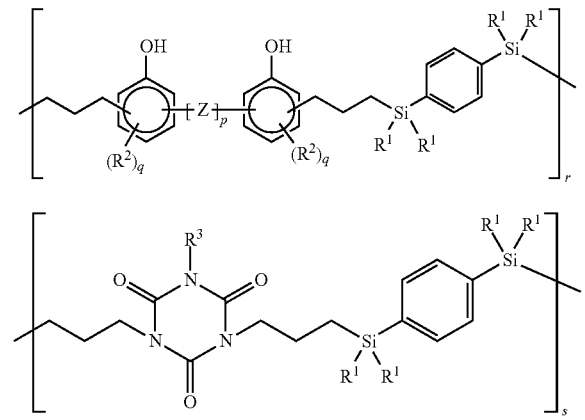

-continued

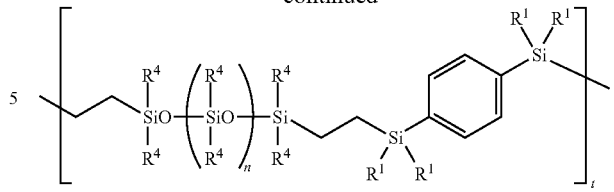

wherein $R^1$, $R^2$, $R^3$, $R^4$, Z, n, p, q, r, s, and t are as defined above, and the terminal silicone atom of the units constituting the repeating unit is bonded to the terminal carbon atom of the same or different unit, and the polymer is terminated with an aliphatic unsaturated group or hydrogen atom bonded to the silicon atom.

More preferably, the silicone resin of the component (A) used is a polymer containing the repeating units represented by the formulae (1-1), (1-2), and (1-3), and in addition, at least one unit selected from the unit represented by the following formula (5), the unit represented by the following (6), and the unit represented by the following formula (7).

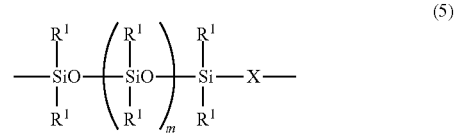

(5)

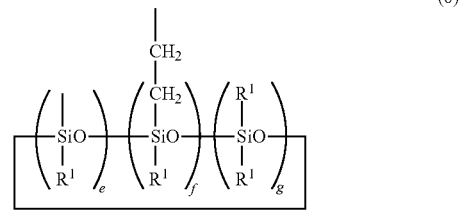

(6)

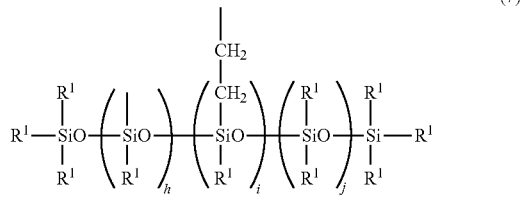

(7)

In the units constituting the repeating unit represented by the formula (1-1), formula (1-2), and formula (1-3), the unit represented by the formula (5), the unit represented by the formula (6), and the unit represented by the formula (7), the terminal silicone atom of is bonded to the terminal carbon atom of the same or different unit. These units may be bonded randomly or as a block polymer. In the formula (5), X is independently a group represented by the $X^1$, $X^2$, or $X^3$, m is an integer of 0 to 100, and preferably 1 to 60. In the formulae (6) and (7), e, f, g, h, i and j are an integer of 0 to 100, and preferably 0 to 30 with the proviso that e+f+g≥3, e and f are not simultaneously 0, and h and i are not simultaneously 0. In the formulae (5), (6) and (7), $R^1$ is as defined above.

The polymer of the present invention may preferably contain at least 5% by mole and up to 80% by mole, and preferably at least 10% by mole and up to 60% by mole of the group represented by the $X^1$ (namely, the formula (2)), at least 10% by mole and up to 70% by mole, and preferably at least 20% by mole and up to 50% by mole of the group represented by the $X^2$ (namely, the formula (3)), and at least 5% by mole and up to 80% by mole, and preferably at least 10% by mole and up to 70% by mole of the group represented by the $X^3$ (namely, formula (4)) in relation to the total molar amount of the groups represented by $X^1$, $X^2$, and $X^3$.

The polymer of the present invention may contain at least one member selected from the units represented by the formulae (5), (6) and (7). The number of each repetitive unit may be the one so that the weight average molecular weight of the polymer in terms of polystyrene as measured by GPC is 3,000 to 500,000, and preferably 5,000 to 200,000. When total number of the units of the repeating units of the formulae (1-1), (1-2), and (1-3) (namely, r+s+t) is a (wherein a is an integer), the repetitive number of the unit represented by the formula (5) is b, the repetitive number of the unit represented by the formula (6) is c, and the repetitive number of the unit represented by the formula (7) is d (b, c, and d respectively being an integer), the value of a in relation to total of the a, b, c, and d is preferably such that $0.05 \leq a/(a+b+c+d) \leq 0.99$, and more preferably $0.2 \leq a/(a+b+c+d) \leq 0.98$. When the polymer has the unit represented by the formula (5), the repetitive number of the unit is preferably a number such that $0.01 \leq b/(a+b+c+d) \leq 0.95$, and more preferably $0.02 \leq b/(a+b+c+d) \leq 0.8$. When the polymer has the unit represented by the formula (6), the repetitive number of the unit is preferably a number such that $0.01 \leq c/(a+b+c+d) \leq 0.8$, and more preferably $0.02 \leq c/(a+b+c+d) \leq 0.8$. When the polymer has the unit represented by the formula (7), the repetitive number of the unit is preferably a number such that $0.01 \leq d/(a+b+c+d) \leq 0.8$, and more preferably $0.02 \leq d/(a+b+c+d) \leq 0.8$.

The polymer of the present invention may further contain the units as shown below.

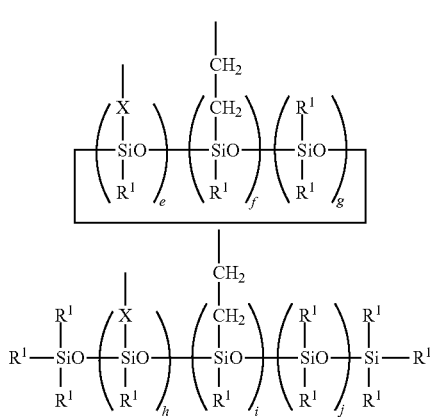

wherein $R^1$, X, e, f, g, h, i and j are as defined above, and the terminal carbon atom of each unit is bonded to the terminal silicon atom of the units as described above.

The polymer having the repeating units represented by the formulae (1-1), (1-2), and (1-3) and the unit represented by the formula (5) may be represented by the following:

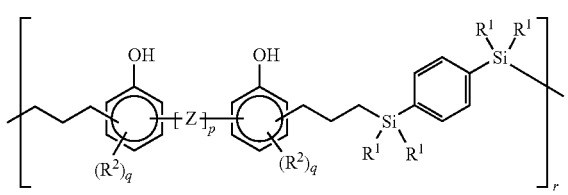

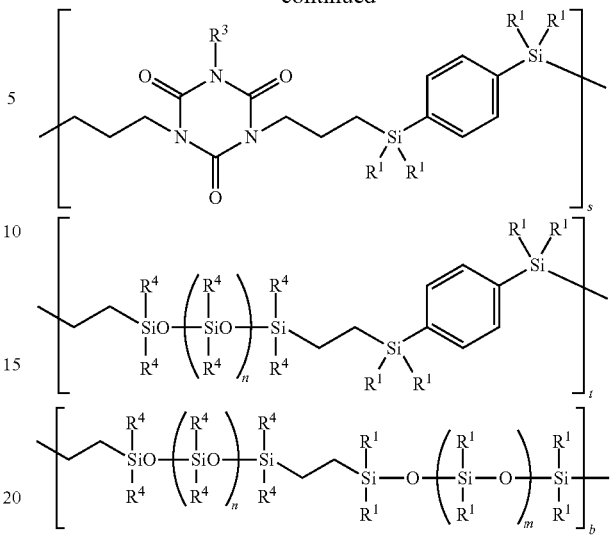

wherein $R^1$, $R^2$, $R^3$, $R^4$, Z, n, m, p, q, r, s, t, and b are as defined above, and the terminal silicone atom of the units constituting the repeating unit is bonded to the terminal carbon atom of the same or different unit, and the polymer is terminated with an aliphatic unsaturated group or hydrogen atom bonded to the silicon atom.

The polymer having the repeating units represented by the formulae (1-1), (1-2), and (1-3) and the unit represented by the formula (6) may be represented by the following:

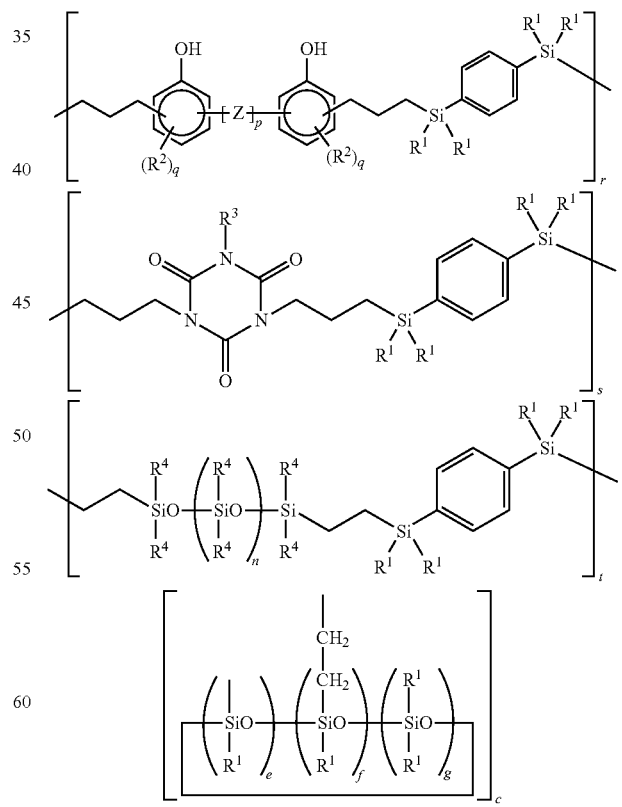

wherein $R^1$, $R^2$, $R^3$, $R^4$, Z, n, p, q, e, f, g, r, s, t, and c are as defined above, and the terminal silicone atom of the units constituting the repeating unit is bonded to the terminal carbon atom of the same or different unit, and the polymer is terminated with an aliphatic unsaturated group or hydrogen atom bonded to the silicon atom.

The polymer having the repeating units represented by the formulae (1-1), (1-2), and (1-3) and the unit represented by the formula (7) may be represented by the following:

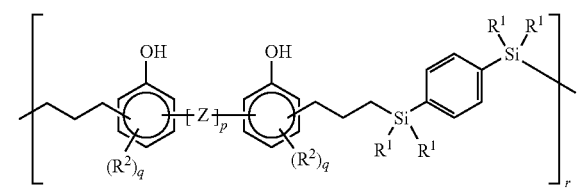

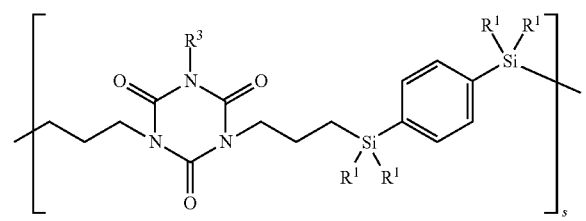

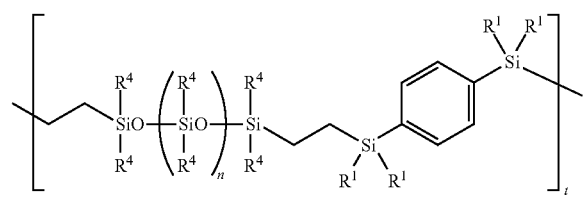

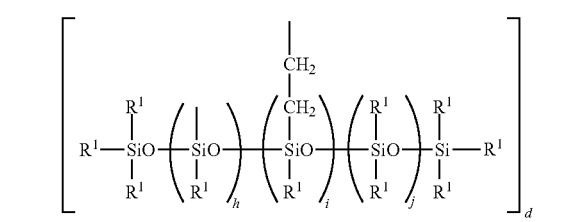

wherein $R^1$, $R^2$, $R^3$, $R^4$, Z, n, p, q, h, i, j, r, s, t, and d are as defined above, and the terminal silicone atom of the units constituting the repeating unit is bonded to the terminal carbon atom of the same or different unit, and the polymer is terminated with an aliphatic unsaturated group or hydrogen atom bonded to the silicon atom.

The polymer having the repeating unit represented by the formulae (1-1), (1-2), and (1-3) may be prepared by a method including the step of addition polymerization of the compound represented by the following formula (8):

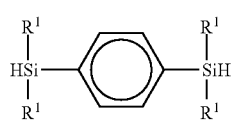
(8)

wherein $R^1$ is as defined above; the compound represented by the following formula (9):

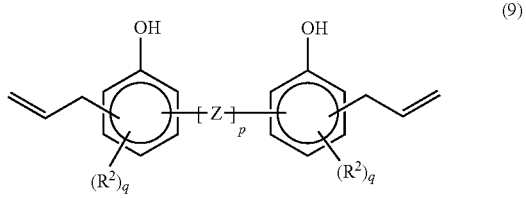
(9)

wherein Z, $R^2$, p, and q are as defined above; the compound represented by the following formula (10):

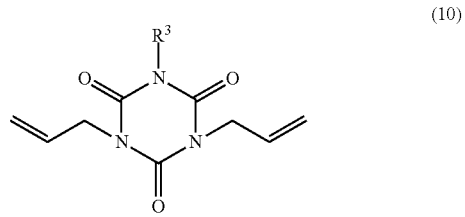
(10)

wherein $R^3$ is as defined above; and the compound represented by the following formula (11):

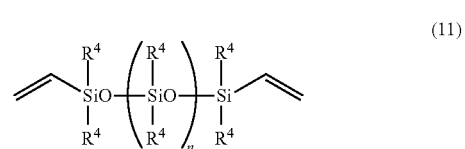
(11)

wherein $R^4$ and n are as defined above; in the presence of a metal catalyst.

Examples of the compounds represented by formula (11) include:

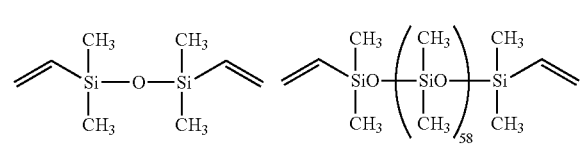

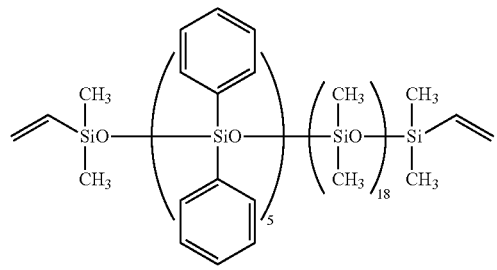

The polymer having the repeating units represented by the formulae (1-1), (1-2), and (1-3), and at least one of the unit represented by the formula (5), the unit represented by the formula (6), and the unit represented by the formula (7) may be prepared by a method including the step of addition polymerization of the compound represented by formula (8), the compound represented by formula (9), the compound represented by formula (10), the compound represented by formula (11), and at least one member of the compounds represented by the following formulae (12), (13), and (14):

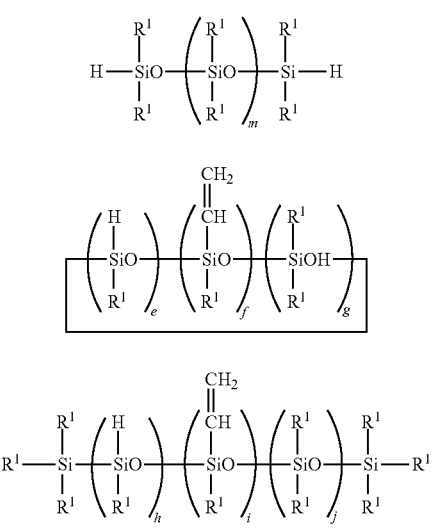

wherein $R^1$, m, e, f, g, h, i and j are as described above in the presence of a metal catalyst.

Examples of the compounds represented by formula (13) include those as shown below.

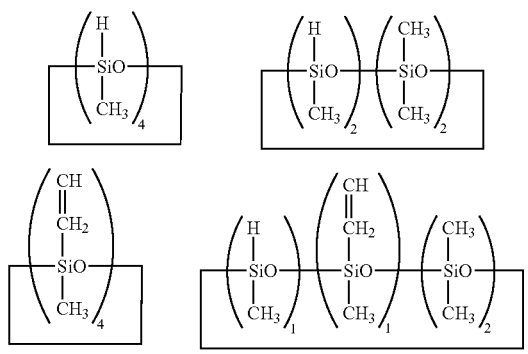

Examples of the compounds represented by formula (14) include those as shown below.

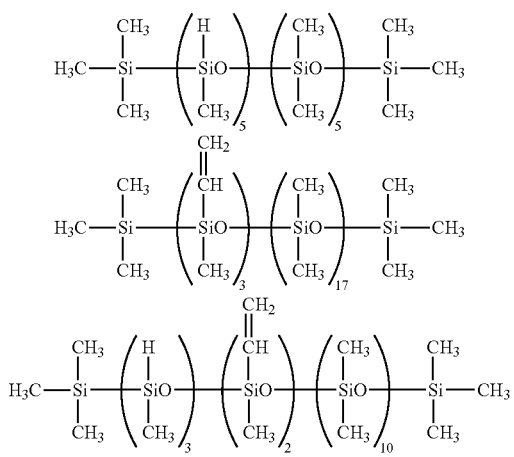

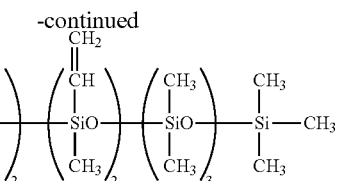

Exemplary metal catalysts used include simple substance of a platinum group metal such as platinum (including platinum black), rhodium, and palladium; platinum chloride, chloroplatinic acid, and chloroplatinate salts such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$, and $Na_2HPtCl_4 \cdot xH_2O$ wherein, x is preferably an integer of 0 to 6, and more preferably 0 or 6; alcohol-modified chloroplatinic acid (for example, those described in U.S. Pat. No. 3,220,972); a complex of chloroplatinic acid and an olefin (for example, those described in U.S. Pat. No. 3,159,601, U.S. Pat. No. 3,159,662, and U.S. Pat. No. 3,775,452); a platinum group metal such as platinum black and palladium loaded on a carrier such as alumina, silica, or carbon; a rhodium-olefin complex; chlorotris(triphenylphosphine) rhodium (so called Wilkinson catalyst); and a complex of platinum chloride, chloroplatinic acid or a chloroplatinate salt with a vinyl group-containing siloxane (and in particular, vinyl group-containing cyclic siloxane).

The catalyst may be used at a catalytic amount, and in particular, at 0.0001 to 0.1% by weight, and preferably 0.001 to 0.01% by weight in terms of the platinum group metal in relation to the entire amount of the starting compounds involved in the reaction. If desired, a solvent may be used in the reaction while addition reaction may be conducted in the absence of the solvent. Exemplary solvents include hydrocarbon solvents such as toluene and xylene. The reaction temperature my be any temperature as long as the polymerization can be completed in short time without losing catalytic activity, and the preferable temperature is typically 40 to 150° C., and in particular, 60 to 120° C. The reaction time may be adequately selected depending on the type and amount of the intended polymer product, and the reaction time is typically 0.5 to 100 hours, and in particular, 0.5 to 30 hours. When a solvent is used, the solvent is removed after the reaction by distillation at a reduced pressure.

The reaction method is not particularly limited. For example, when the compound represented by formula (8), the compound represented by formula (9), the compound represented by formula (10), and the compound represented by formula (11) are to be reacted, the compounds represented by formula formulae (9), (10), and (11) may be mixed, and after heating the mixture, a metal catalyst may be added to the mixture, and then, the compound represented by formula (8) may be added dropwise preferably in 0.1 to 5 hours. When the compound represented by formula (12) is reacted, the compound represented by formula (8) and the compound represented by formula (12) may be added dropwise simultaneously or separately, and if desired, as a mixture preferably in 0.1 to 5 hours.

When the compound represented by formula (13) and the compound represented by formula (14) are also reacted, the compounds represented by formulae (8), (9), (10), and (11) and optionally, the compound represented by formula (12) are preferably allowed to undergo the addition polymerization, and then, the mixture is stirred for 0.5 to 100 hours, and in particular, 0.5 to 30 hours. The compound represented by formula (13) or the compound represented by formula (14) is then added dropwise to the resulting solution in 0.1 to 5 hours, and the mixture is stirred for 1 to 10 hours, and in particular, 2 to 5 hours. Simultaneous reaction of the compounds represented by formulae (8) to (12) with the compound represented by formula (13) or (14) may result in the gelation of the product.

The compounds may be blended at a blend ratio such that total molar amount of the hydrosilyl groups in the compounds represented by the formulae (8), (12), (13), and (14) is 0.67 to 1.67, and preferably 0.83 to 1.25 in relation to the total molar amount of the alkenyl groups in the compounds represented by the formulae (9), (10), (11), (13), and (14). The weight average molecular weight of the polymer may be regulated by using a monoallyl compound such as o-allylphenol, monohydrosilane such as triethylhydrosilane, or a monohydrosiloxane as a molecular weight regulator.

(B) Thermosetting Resin

The component (B) improves adhesion and protection of the wafer by the resin composition of the present invention. The thermosetting resin used in the present invention is not particularly limited, and exemplary thermosetting resins include epoxy resin, phenol resin, melamine resin, urethane resin, and polyester resin. The preferred is use of an epoxy resin. The epoxy resin may undergo crosslinking with the phenolic hydroxy group or epoxy group in the silicone resin (A). Accordingly, when the thermosetting resin is an epoxy resin, the thermosetting resin and the silicone resin (A) will be crosslinked in the course of curing of the resin composition, thereby improving the adhesion to and protection of the wafer and reliability will be improved.

Examples of the epoxy resin used include bisphenol A epoxy resins, bisphenol F epoxy resins, hydrogenated bisphenol A and bisphenol F epoxy resins, glycidyl ether epoxy resins such as phenol novolac epoxy resin and cresol novolac epoxy resin, glycidyl ester epoxy resins such as glycidyl hexahydrophthalate ester and glycidyl dimer acid ester, glycidylamine epoxy resins such as triglycidyl isocyanurate and tetraglycidyl diaminodiphenylmethane, and the preferred are bisphenol A epoxy resins, bisphenol F epoxy resins, phenol novolac epoxy resins, and cresol novolac epoxy resins. Commercially available such epoxy resins (product names) include jER1001 (manufactured by Mitsubishi Chemical), EPICLON 830S (manufactured by DIC), jER517 (manufactured by Mitsubishi Chemical), and EOCN103S (manufactured by Nippon Kayaku Co., Ltd.).

The thermosetting resin used may be a phenol resin. Examples of the phenol resin include resol phenol resins and/or novolac phenol resins prepared by using phenol, alkylphenols such as bisphenol F, p-t-butylphenol, octylphenol, and p-cumyl phenol, and p-phenylphenol, cresol, or the like for the starting material, which may be used alone or in combination of two or more.

Amount of the thermosetting resin blended is not particularly limited. However, 5 to 100 parts by weight, and more preferably 5 to 50 parts by weight of the thermosetting resin is used in relation to 100 parts by weight of the component (A). Use of the thermosetting resin at an amount in such range is preferable since the resulting resin composition will exhibit improved adhesion and protection, and the cured resin composition will be reliable.

The resin composition of the present invention may contain an epoxy resin curing agent and/or an epoxy resin curing aid in addition to the epoxy resin. Incorporation of the epoxy resin curing agent and/or the epoxy resin curing aid will facilitate adequate and homogeneous proceeding of the curing reaction. The epoxy resin curing agent may be blended at 1 to 50 parts by weight, and preferably at 2 to 20 parts by weight in relation to 100 parts by weight of the component (A), and the epoxy resin curing aid may be blended at 0.1 to 10 parts by weight, and preferably at 0.2 to 5 parts by weight in relation to 100 parts by weight of the component (A).

The epoxy resin curing agent is not particularly limited, any curing agent commonly used in the art may be used. However, the preferred is use of an aromatic curing agent or an alicyclic curing agent in view of the heat resistance. Exemplary epoxy resin curing agents include amine curing agents, acid anhydride curing agents, boron trifluoride amine complex, and phenol resins. Exemplary amine curing agents include aliphatic amine curing agents such as diethylenetriamine, triethylenetetramine, and tetraethylenepentamine, alicyclic amine curing agents such as isophorone diamine, aromatic amine curing agents such as diaminodiphenylmethane and phenylenediamine, and dicyane diamide, and among these, the preferred is aromatic amine curing agent. Exemplary acid anhydride curing agents include phthalic anhydride, pyromellitic acid anhydride, trimellitic acid anhydride, and hexahydrophthalic anhydride. The epoxy resin curing agent may be used alone or in combination of two or more.

Exemplary epoxy resin curing aids include imidazole compounds such as 2-methylimidazole, 2-ethylimidazole, 2-ethyl-4-methylimidazole, and ethyl isocyanates of such compound, 2-phenylimidazole, 2-phenyl-4-methyl imidazole, 2-phenyl-4-methyl-5-hydroxymethylimidazol, and 2-phenyl-4,5-dihydroxymethylimidazol; DBU compounds such as 1,8-diazabicyclo (5.4.0) undecene-7 (DBU), 1,5-diazabicyclo (4.3.0) nonene-5 (DBN), organic acid salts of DBU, phenol resin salts of DBU, and tetraphenylborate salts of a DBU derivative; triorganophosphines such as triphenylphosphine, tributylphosphine, tris(p-methylphenyl) phosphine, tris(p-methoxyphenyl)phosphine, tris(p-ethoxyphenyl)phosphine, triphenylphosphine-triphenylborate, and tetraphenylphosphine-tetraphenyl borate; quaternary phosphonium salts; and tertiary amine and its tetraphenylborate salts such as triethylene ammonium-triphenylborate. The epoxy resin curing aid as described above may be used alone or in combination of two or more.

(C) Filler

The component (C) improves reliability of the resin composition of the present invention by improving wafer protectivity, and also, heat resistance, moisture resistance, strength, and the like. Exemplary fillers include talc, calcined silica, uncalcined clay, mica, silicate salts such as glass, oxides such as titanium oxide, alumina, molten silica (molten spherical silica, and molten pulverized silica), and crystalline silica powder; carbonate salts such as calcium carbonate, magnesium carbonate, and hydrotalcite; hydroxides such as aluminum hydroxide, magnesium hydroxide, and calcium hydroxide; sulfate and sulfite salts such as barium sulfate, calcium sulfate, and calcium sulfite; borate salts such as zinc borate, barium metaborate, aluminum borate, calcium borate, and sodium borate; and nitrides such as aluminum nitride, boron nitride, and silicon nitride; which may be used alone or in combination of two or more. Among these, the preferred are silica powders such as molten silica and crystalline silica, and exemplary such silica powders include reinforcing silicas such as fumed silica and precipitated silica; and crystalline silica such as quartz. Examples include Aerosil R972, R974, and R976 manufactured by Nippon Aerosil; SE-2050, SC-2050, SE-1050, SO-E1, SO-C1, SO-E2, SO-C2, SO-E3, SO-C3, SO-E5, and SO-C5 manufactured by Admatechs; and Musil120A and Musil130A manufactured by Shin-Etsu Chemical Co., Ltd.

The filler is not particularly limited for its average particle diameter, and preferably, the filler has an average particle diameter of at least 0.01 µm and up to 20 µm, and more preferably at least 0.01 µm and up to 10 µml. The average particle diameter of the inorganic filler less than the lower limit as described above is unpreferable because of the reduced strength due to agglomeration of the inorganic filler while the average particle diameter in excess of the upper limit is unpreferable in view of the reduced filling ability due to reduced flowability which inhibits flowability between the chips. The average particle diameter may be determined as a weight average value $D_{50}$ (namely, particle diameter when cumulative weight is 50% or median diameter) by laser diffractometry using a particle size distribution analyzer.

Content of the filler is preferably at least 30% by weight and up to 85% by weight, and preferably at least 50% by weight and up to 80% by weight of the total weight of the resin composition of the present invention. Content of the filler in excess of such range is unpreferable due to loss of the film properties as well as decrease in the resin flowability which results in poor filling ability.

Silane Coupling Agent

The resin composition of the present invention may contain a silane coupling agent. Incorporation of the silane coupling agent enables further improvement in the adhesion of the resin composition to the substrate. Exemplary silane coupling agents include epoxy silane coupling agents and aromatic group-containing aminosilane coupling agents which may be used alone or in combination of two or more. Content of the silane coupling agent is not particularly limited. However, the content is preferably at least 0.01% by weight and up to 5% by weight in the total weight of the adhesive composition of the present invention.

The resin composition of the present invention may also contain components other than those as described above. For example, various additives may be added for improving compatibility of the silicone resin (A) with the thermosetting resin (B), or improving storage stability, workability, or other properties of the resin composition. Examples include internal mold release agents such as fatty acid ester, glyceric acid ester, zinc stearate, and calcium stearate and antioxidants such as phenol, phosphorus, or sulfur antioxidants, and these additives may be added to the extent not adversely affecting the merits of the present invention. The additional optional components may be added to the resin composition of the present invention without using any solvent, or after dissolving or dispersing in an organic solvent for addition in the form of a solution or dispersion. The solvent used may be an organic solvent which is described below as the solvent used for preparing the resin composition dispersion.

Organic Solvent

The additional optional components may be added to the adhesive composition of the present invention without using any solvent, or after dissolving or dispersing in an organic solvent for addition in the form of a solution or dispersion (hereinafter simply referred to as the "solution"). Examples of such organic solvent include N,N-dimethyl acetamide, methyl ethyl ketone, N,N-dimethylformamide, cyclohexanone, cyclopentanone, N-methyl-2-pyrrolidone, toluene, methanol, ethanol, isopropanol, acetone, propylene glycol monomethylether, and propylene glycol monomethylether acetate, and the preferred are methyl ethyl ketone, cyclopentanone, propylene glycol monomethylether, and propylene glycol monomethylether acetate, which may be used alone or in combination of two or more.

[Resin Film]

The resin composition of the present invention is preferably formed in the shape of a film. The resin composition formed in the shape of such resin film is particularly suited for use in the molding of a large diameter thin film wafer, and resin casting in the simultaneous molding of the wafer will no longer be required. Accordingly, use of the composition in such film form fundamentally solves the problems which may be associated with the conventional transfer molding such as wire deformation and insufficient filling of the wafer surface as well as the problems which may be associated with the conventional press molding such as difficulty in the control of the molding area and flowability and physical properties of the liquid sealing resin.

Preferably, the resin film has a thickness of at least 100 µm and up to 700 µm since the resin film exhibits high resistance to warpage as well as high protectivity at such thickness.

Accordingly, the present invention provides a resin film formed from the resin composition as described above. Examples of such film include a resin film formed from the resin composition of the present invention and a resin film also having a protective layer covering the resin film. The protective layer used may be the one as described below. An embodiment of the production of the resin film of the present invention is hereinafter described.

The silicone resin (A), the thermosetting resin (B), and the filler (C) of the present invention, other optional components, and the organic solvent are preliminarily mixed to prepare a solution of the resin composition in liquid form. The solution of the resin composition solution is coated on the protective layer by using a reverse roll coater, Comma Coater, or the like, and the protective layer coated with the resin composition solution is then passed through an in-line dryer at 80 to 160° C. for 2 to 20 minutes to thereby remove the organic solvent and dry the composition. The film is then adhered and laminated with another protective layer by using a roll laminator to thereby obtain the resin film.

Protective Layer (Protective Film/Release Film)

The protective layer is not particularly limited as long as it can be peeled from the resin composition of the present invention with no adverse effect on the shape of the resin film. Typical examples include plastic films such as polyethylene (PE) film, polypropylene (PP) film, polymethyl pentene (TPX) film, and polyester films imparted with mold releasability.

[Wafer Used for Molding]

The wafer simultaneously molded by the resin film of the present invention is not particularly limited, and the wafer may be a wafer having semiconductor devices (chips) mounted on its surface or a semiconductor wafer having semiconductor divides formed on the surface. The resin film of the present invention before the molding is well adapted for filling the surface of such wafer, while it exhibits low warpage after the molding with high protectivity of such wafer. The resin film of the present invention is well adapted for molding a large diameter wafer having a diameter of, for example, 8 inches (200 mm) and 12 inches (300 mm) as well as a thin film wafer, although the wafer molded is not particularly limited.

[Wafer Molding Method]

The method used for molding a wafer by using the resin film of the present invention is not particularly limited. In an exemplary method, the protective film on one side of the resin film is peeled off the film, and the remaining resin film with the other release film is closely attached to the wafer by using a vacuum laminator (product name, TEAM-100RF) manufactured by Takatori Corporation in a vacuum chamber controlled to a vacuum of 50 to 1,000 Pa, for example, 100 Pa and a temperature of 80 to 130° C., for example, 100° C. When the pressure has returned to the normal pressure, the substrate is cooled to 25° C., and then, removed from the vacuum laminator. The other release film is then peeled off the resin film.

[Semiconductor Device]

The present invention also provides a semiconductor device having a heat cured film prepared by singulating the semiconductor wafer molded by heat curing the resin film. The semiconductor device prepared by singulating the well-protected wafer with low warpage of the present invention is a high quality semiconductor device with high yield.

[Production Method of the Semiconductor Device]

The present invention also provides a method for producing a semiconductor device comprising the steps of peeling one protective film of the resin film from the resin film, and attaching the resin film having the surface exposed to the semiconductor wafer, and peeling the other release film from the resin film to thereby mold the semiconductor wafer, and singulating the molded semiconductor wafer.

EXAMPLES

Next, the present invention is described in further detail by referring to Synthetic Examples, Examples, and Comparative Examples which by no means limit the scope of the present invention.

Synthetic Examples 1 to 5

In the Synthetic Examples, weight average molecular weight of the polymer was measured by gel permeation chromatography (GPC) using monodispersed polystyrene for the standard with a GPC column TSKgel Super HZM-H (manufactured by TOSOH Corporation) using tetrahydrofuran for the elution solvent at a flow rate of 0.6 ml/min and a column temperature of 40° C. $^1$H-NMR analysis of the polymer was conducted by JNM-LA300WB (manufactured by JEOL) using deuterated chloroform for the measurement solvent.

The compounds used in Synthetic Examples 1 to 5 were as shown below.

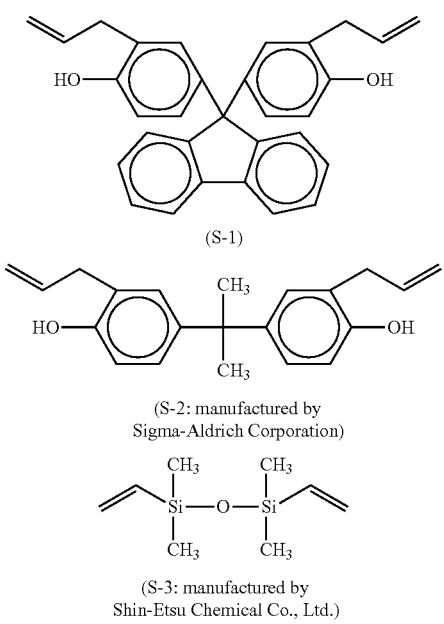

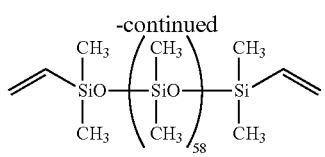

(S-4: manufactured by Shin-Etsu Chemical Co., Ltd.)

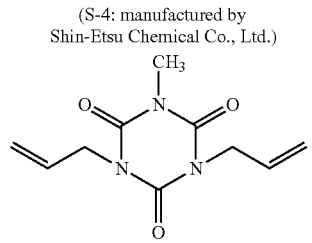

(S-5: manufactured by Shikoku Chemicals Corporation)

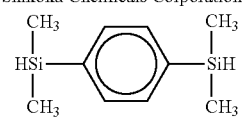

(S-6: manufactured by Shin-Etsu Chemical Co., Ltd.)

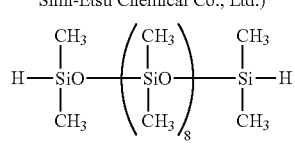

(S-7: manufactured by Shin-Etsu Chemical Co., Ltd)

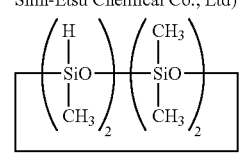

(S-8: manufactured by Shin-Etsu Chemical Co., Ltd.)

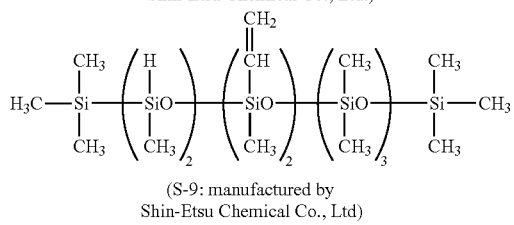

(S-9: manufactured by Shin-Etsu Chemical Co., Ltd)

Synthetic Example 1

In a 3 L flask equipped with an agitator, a thermometer, a nitrogen purging system, and a reflux condenser, 86.1 g (0.2 mole) of the compound represented by the formula (S-1), 93.0 g (0.5 mole) of the compound represented by the formula (S-3), and 66.9 g (0.3 mole) of the compound represented by the formula (S-5) were added, and then, 1,300 g of toluene was added. After heating the mixture to 70° C., 1.0 g toluene solution of chloroplatinic acid (platinum concentration, 0.5% by weight) was added, and then, 194.4 g (1.0 mole) of the compound represented by the formula (S-6) was added dropwise for 1 hour (total molar amount of the hydrosilyl group/total molar amount of the alkenyl group=1/1). After the dropwise addition, the mixture was heated to 100° C. and aged for 6 hours, and toluene was removed from the reaction mixture by distillation. In the $^1$H-NMR analysis, the resulting compound was a polymer represented by the following formula. The polymer had a weight average molecular weight in terms of polystyrene measured by GPC of 42,000.

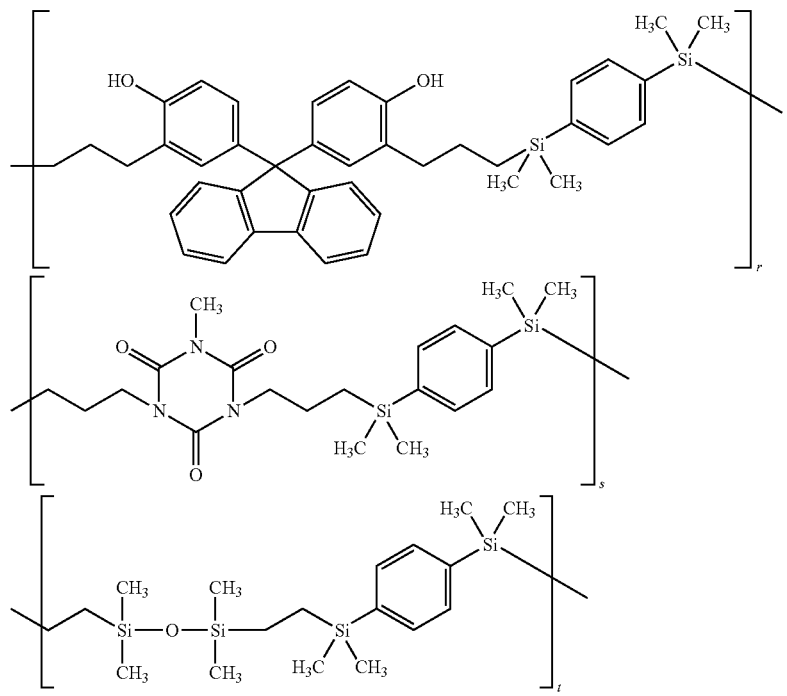

In the formula, r/(r+s+t) is 0.2, s/(r+s+t) is 0.3, and t/(r+s+t) is 0.5; terminal silicon atom of each unit is bonded to the terminal carbon atom of the same or different unit, one terminal of the polymer is an alkenyl group, and the other terminal of the polymer is the hydrogen atom bonded to the silicon atom.

Synthetic Example 2

In a 3 L flask equipped with an agitator, a thermometer, a nitrogen purging system, and a reflux condenser, 71.8 g (0.167 mole) of the compound represented by the formula (S-1), 333.3 g (0.074 mole) of the compound represented by the formula (S-4), and 14.9 g (0.067 mole) of the compound represented by the formula (S-5) were added, and then, 1,150 g of toluene was added. After heating the mixture to 70° C., 1.0 g toluene solution of chloroplatinic acid (platinum concentration, 0.5% by weight) was added, and then, 64.8 g (0.333 mole) of the compound represented by the formula (S-6) was added dropwise for 30 minutes (total molar amount of the hydrosilyl group/total molar amount of the alkenyl group=1.08/1). After the dropwise addition, the mixture was heated to 100° C. and aged for 6 hours, and toluene was removed from the reaction mixture by distillation. In the $^1$H-NMR analysis, the resulting compound was a polymer represented by the following formula. The polymer had a weight average molecular weight in terms of polystyrene measured by GPC of 55,000.

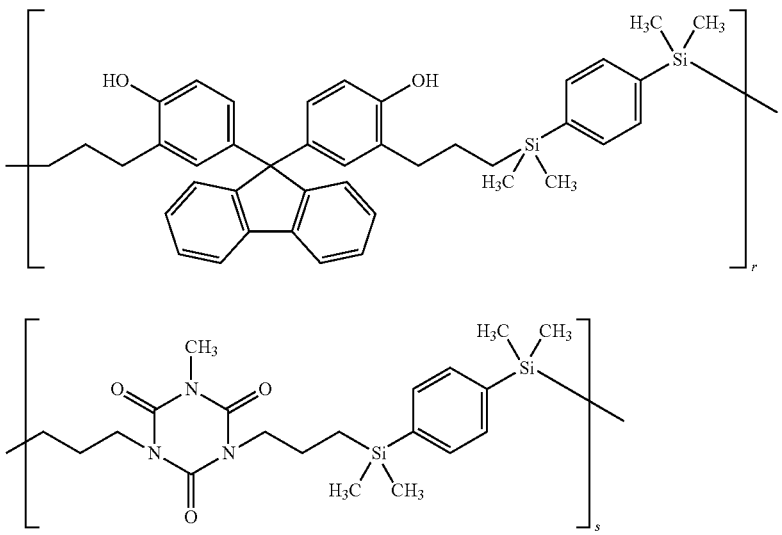

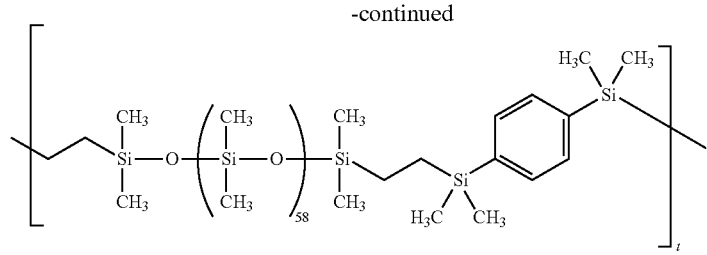

In the formula, r/(r+s+t) is 0.5, s/(r+s+t) is 0.2, and t/(r+s+t) is 0.3; terminal silicon atom of each unit is bonded to the terminal carbon atom of the same or different unit, one terminal of the polymer is an alkenyl group, and the other terminal of the polymer is the hydrogen atom bonded to the silicon atom.

Synthetic Example 3

In a 3 L flask equipped with an agitator, a thermometer, a nitrogen purging system, and a reflux condenser, 61.8 g (0.2 mole) of the compound represented by the formula (S-2), 93.0 g (0.5 mole) of the compound represented by the formula (S-3), and 66.9 g (0.3 mole) of the compound represented by the formula (S-5) were added, and then, 1,000 g of toluene was added. After heating the mixture to 70° C., 1.0 g toluene solution of chloroplatinic acid (platinum concentration, 0.5% by weight) was added, and then, 179.0 g (0.92 mole) of the compound represented by the formula (S-6) and 54.8 g (0.075 mole) of the compound represented by the formula (S-7) was added dropwise for 1 hour (total molar amount of the hydrosilyl group/total molar amount of the alkenyl group=1/1). After the dropwise addition, the mixture was heated to 100° C. and aged for 6 hours, and toluene was removed from the reaction mixture by distillation. In the $^1$H-NMR analysis, the resulting compound was a polymer represented by the following formula. The polymer had a weight average molecular weight in terms of polystyrene measured by GPC of 52,000.

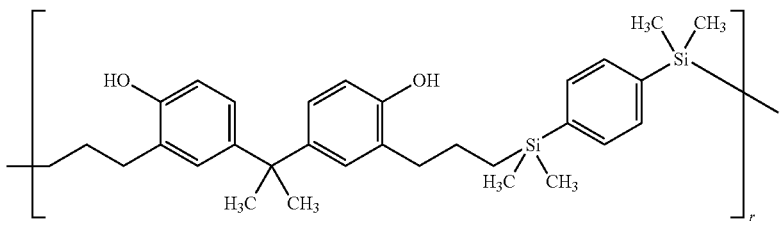

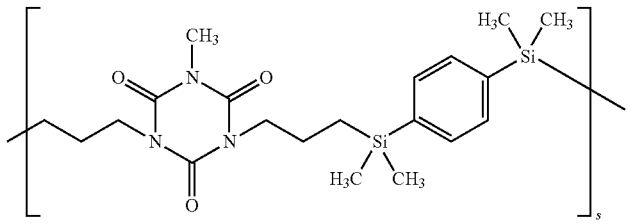

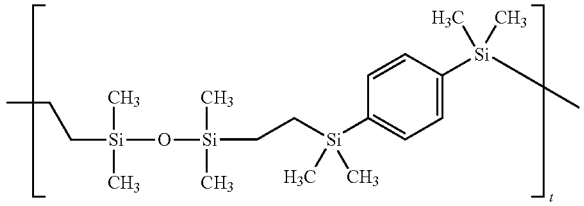

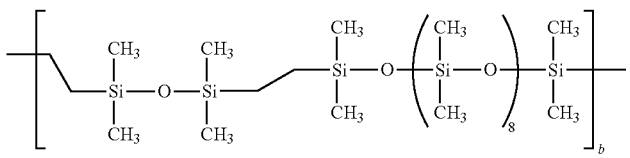

In the formula, r/(r+s+t+b) is 0.2, s/(r+s+t+b) is 0.3, t/(r+s+t+b) is 0.4, and b/(r+s+t+b) is 0.1; terminal silicon atom of each unit is bonded to the terminal carbon atom of the same or different unit, one terminal of the polymer is an alkenyl group, and the other terminal of the polymer is the hydrogen atom bonded to the silicon atom.

Synthetic Example 4

In a 3 L flask equipped with an agitator, a thermometer, a nitrogen purging system, and a reflux condenser, 61.8 g (0.2 mole) of the compound represented by the formula (S-2), 93.0 g (0.5 mole) of the compound represented by the formula (S-3), and 66.9 g (0.3 mole) of the compound represented by the formula (S-5) were added, and then, 1,000 g of toluene was added. After heating the mixture to 70° C., 1.0 g toluene solution of chloroplatinic acid (platinum concentration, 0.5% by weight) was added, and then, 179.0 g (0.92 mole) of the compound represented by the formula (S-6) was added dropwise for 1 hour. After the dropwise addition, the mixture was heated to 100° C. and aged for 6 hours, and 26.8 g (0.083 mole) of the compound represented by the formula (S-8) was added for 1 hour (total molar amount of the hydrosilyl group/total molar amount of the alkenyl group=1/1). After the dropwise addition, the mixture was aged at 100° C. for 2 hours, and toluene was removed from the reaction mixture by distillation. In the $^1$H-NMR analysis, the resulting compound was a polymer represented by the following formula. The polymer had a weight average molecular weight in terms of polystyrene measured by GPC of 66,000.

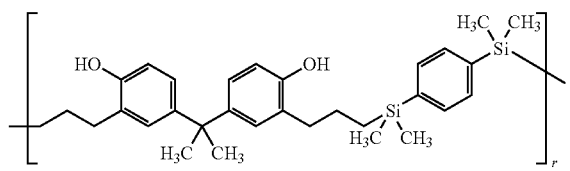

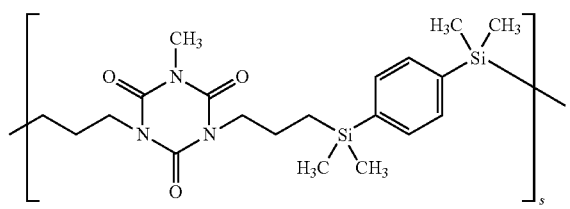

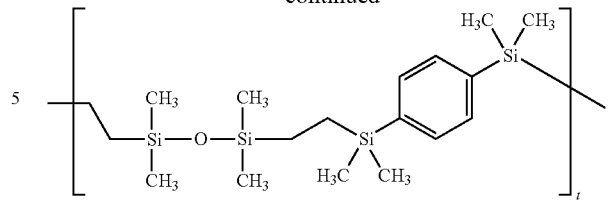

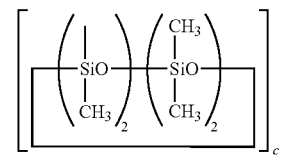

In the formula, r/(r+s+t+c) is 0.2, s/(r+s+t+c) is 0.3, t/(r+s+t+c) is 0.4, and c/(r+s+t+c) is 0.1; terminal silicon atom of each unit is bonded to the terminal carbon atom of the same or different unit, one terminal of the polymer is an alkenyl group, and the other terminal of the polymer is the hydrogen atom bonded to the silicon atom.

Synthetic Example 5

In a 3 L flask equipped with an agitator, a thermometer, a nitrogen purging system, and a reflux condenser, 142.1 g (0.33 mole) of the compound represented by the formula (S-1), 70.7 g (0.38 mole) of the compound represented by the formula (S-3), and 66.9 g (0.3 mole) of the compound represented by the formula (S-5) were added, and then, 1,000 g of toluene was added. After heating the mixture to 70° C., 2.0 g toluene solution of chloroplatinic acid (platinum concentration, 0.5% by weight) was added, and then, 190.5 g (0.98 mole) of the compound represented by the formula (S-6) was added dropwise for 1.5 hours. After the dropwise addition, the mixture was heated to 100° C. and aged for 6 hours, and 6.8 g (0.01 mole) of the compound represented by the formula (S-9) was added for 0.1 hour (total molar amount of the hydrosilyl group/total molar amount of the alkenyl group=1/1.03). After the dropwise addition, the mixture was aged at 100° C. for 2 hours, and toluene was removed from the reaction mixture by distillation. In the $^1$H-NMR analysis, the resulting compound was a polymer represented by the following formula. The polymer had a weight average molecular weight in terms of polystyrene measured by GPC of 50,000.

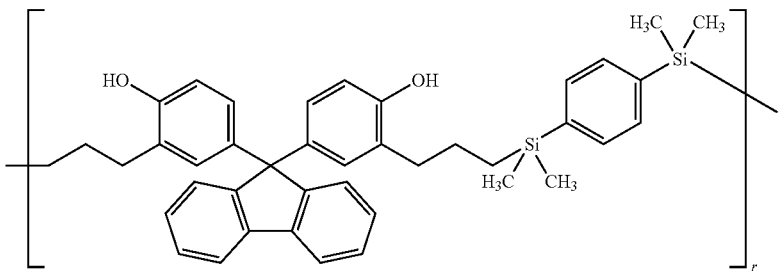

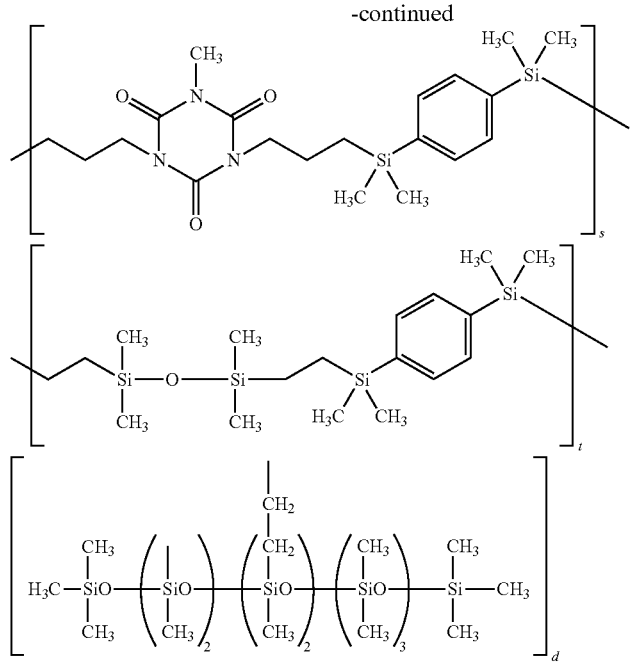

In the formula, r/(r+s+t+d) is 0.32, s/(r+s+t+d) is 0.30, t/(r+s+t+d) is 0.37, and d/(r+s+t+d) is 0.01; terminal silicon atom of each unit is bonded to the terminal carbon atom of the same or different unit, one terminal of the polymer is an alkenyl group, and the other terminal of the polymer is the hydrogen atom bonded to the silicon atom.

Comparative Synthetic Example 1

The Example Prepared without Using the Compound Having Isocyanuric Skeleton which is a Critical Component of the Present Invention In a 3 L flask equipped with an agitator, a thermometer, a nitrogen purging system, and a reflux condenser, 142.1 g (0.33 mole) of the compound represented by the formula (S-2) and 70.7 g (0.38 mole) of the compound represented by the formula (S-3) were added, and then, 1,500 g of toluene was added. After heating the mixture to 70° C., 2.0 g toluene solution of chloroplatinic acid (platinum concentration, 0.5% by weight) was added, and then, 132.2 g (0.68 mole) of the compound represented by the formula (S-6) was added dropwise for 1.5 hour. After the dropwise addition, the mixture was heated to 100° C. and aged for 6 hours, and 6.8 g (0.01 mole) of the compound represented by the formula (S-9) was added for 0.1 hour (total molar amount of the hydrosilyl group/total molar amount of the alkenyl group=1/1.01). After the dropwise addition, the mixture was aged at 100° C. for 2 hours to obtain a polymer solution, and toluene was removed from this solution by distillation. In the $^1$H-NMR analysis, the resulting compound was a polymer represented by the following formula. The polymer had a weight average molecular weight in terms of polystyrene measured by GPC of 48,000.

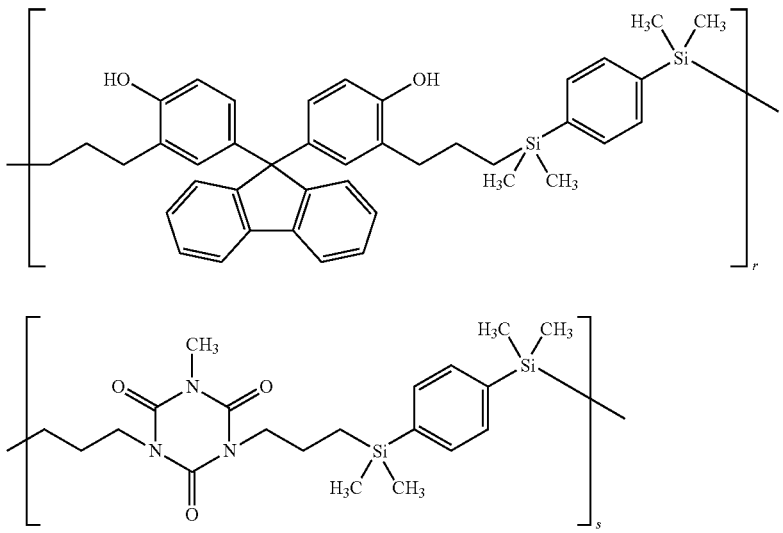

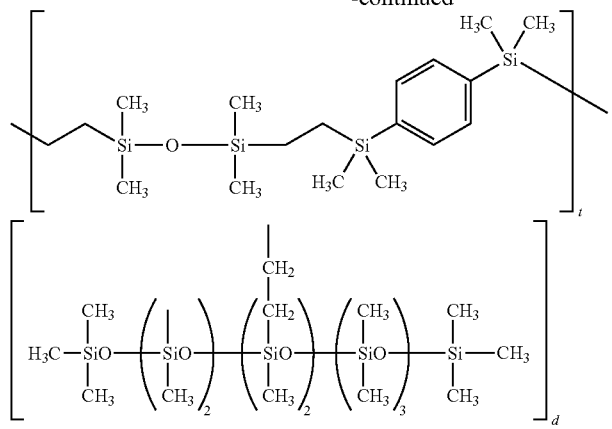

In the formula, r/(r+s+t+d) is 0.46, s/(r+s+t+d) is 0, t/(r+s+t+d) is 0.53, and d/(r+s+t+d) is 0.01; terminal silicon atom of each unit is bonded to the terminal carbon atom of the same or different unit, one terminal of the polymer is an alkenyl group, and the other terminal of the polymer is the hydrogen atom bonded to the silicon atom.

Examples 1 to 7 and Comparative Examples 1 to 3

Preparation of the Resin Composition

The composition described in Table 1 was prepared by blending the silicone resin (A) synthesized in the Synthetic Examples 1 to 5, the thermosetting resin (B), and the filler (C), adding cyclopentanone of at an amount so that concentration of the solid component is 60% by weight, agitating with a ball mill for mixing, dissolution, and dispersion to thereby prepare a dispersion of the resin composition. The unit of the content in Table 1 is "parts by weight". Comparative Example 1 is a resin composition not containing the thermosetting resin (B), and Comparative Example 2 is a resin composition not containing the filler (C). Comparative Example 3 is a resin composition containing a silicone resin which is not the silicone resin (A) of the present invention.

The components used for the preparation of the resin composition were as described below.

[(B) Thermosetting Resin]

EOCN-103S (product name) (epoxy equivalent, 209 to 219; manufactured by Nippon Kayaku Co., Ltd.)

"epoxy equivalent" means equivalent of the epoxy group present in one molecule of each component.

The curing agent and curing aid for epoxy resin as described below were used.

epoxy resin curing agent: RIKACID HH (product name) (hexahydrophthalic anhydride manufactured by New Japan Chemical Co., Ltd.)

epoxy resin curing aid: Curezol 2P4 MHZ (product name) (2-phenyl-4-methyl-5-hydroxymethylimidazol manufactured by Shikoku Chemical Corporation)

[(C) Filler]

Silica (SE2050; average particle size, 0.50 μm; manufactured by Admatechs)

Release film (1): E7304 (manufactured by Toyobo Co., Ltd.; 75 μm; peeling strength, 200 mN/50 mm)

Release film (2): E7302 (manufactured by Toyobo Co., Ltd.; 75 μm; peeling strength, 90 mN/50 mm)

Protective film: polyethylene film (100 μm)

TABLE 1

| Components (parts by weight) | | Example | | | | | | | | Comparative Example | | |
|---|---|---|---|---|---|---|---|---|---|---|---|---|
| | | 1 | 2 | 3 | 4 | 5 | 6 | 7 | 8 | 1 | 2 | 3 |
| Silicone resin (A) | Synthetic Example 1 | 100 | 100 | 100 | | | | | 100 | 100 | 100 | |
| | Synthetic Example 2 | | | | 100 | | | | | | | |
| | Synthetic Example 3 | | | | | 100 | | | | | | |
| | Synthetic Example 4 | | | | | | 100 | | | | | |
| | Synthetic Example 5 | | | | | | | 100 | | | | |
| Silicone rein outside the scope of the present invention | Comparative Synthetic Example 1 | | | | | | | | | | | 100 |
| Thermo- setting resin (B) | EOCN-103S | 20 | 20 | 50 | 15 | 20 | 20 | 20 | 20 | | 20 | 20 |
| | RIKACID HH | | | | 5 | | | | | | | |
| | Curezol 2P4MHZ | 1 | 1 | 1 | 1 | 1 | 1 | 1 | 1 | | 1 | 1 |
| Filler (C) | SE2050 | 125 | 400 | 160 | 125 | 125 | 125 | 125 | 125 | 125 | | 125 |
| Thickness of the resin film (μm) | | 200 | 200 | 200 | 200 | 200 | 200 | 200 | 500 | 200 | 200 | 200 |

Example 1

Formation of Resin Film

The resin composition of Example 1 shown in Table 1 was coated on a release film (1) by using a die coater for the film coater and E7304 for the release film (1). Next, the coated film was passed through a hot air circulating oven (length, 4 m) at 100° C. for 5 minutes to thereby form a resin film having a film thickness of 100 μm on the release film (1). Next, a polyethylene film (thickness, 100 μm) was adhered to the resin film by using a laminate roll at a linear pressure of 10 N/cm to prepare a laminate film (1) comprising the release film (1), the resin film, and the protective film. A laminate film (2) was prepared by repeating the procedure as described above except for the use of E7302 for the release film (2) instead of the release film (1). The polyethylene film was removed from each of the laminate films (1) and (2), and the resin films were laminated and placed in a hot roll laminator heated to 60° C. to prepare a composite film comprising the release film (1), the resin film, and the release film (2) having a film thickness of 200 μm.

Examples 2 to 7 and Comparative Examples 1 to 3

Composite films having a thickness of 200 μm were prepared by repeating the procedure of Example 1.

In Example 8, a resin film having a thickness of 500 μm was prepared by using the resin composition which is the same as the one used in Example 1.

[Molding of the Resin Film to the Wafer]

The silicon wafer used was the one having a wafer thickness of 100 μm and a diameter of 8 inches (200 mm). The release film (2) was peeled from the composite film of Examples 1 to 7 and Comparative Example 1 to 3, and the resin film was adhered to the silicon wafer as described above by using a vacuum laminator (product name, TEAM-100RF; manufactured by Takatori Corporation) in the vacuum chamber adjusted to a vacuum of 100 Pa at 100° C. When the pressure was at normal pressure, the silicon wafer was cooled to 25° C., and the silicon wafer was removed from the vacuum laminator. The other release film (1) was then peeled off the film.

The resulting wafer with the resin film was heated in an inert oven at 180° C. for 2 hours for curing the resin.

[Evaluation 1: Wafer Warpage]

After curing the resin film, warpage of the wafer was measured. The results are shown in Table 2.

[Evaluation 2: Wafer Supporting Ability]

Wafer supporting ability was evaluated by measuring the deflection of the wafer when one end of the wafer was supported. The ability was evaluated "good" when the deflection was within 20 mm, and "poor" when the deflection was in excess of 20 mm. The results are shown in Table 2.

[Evaluation 3: Adhesion]

The resin film (25 μm) was adhered to 6 inch semiconductor wafer (thickness 625 μm, manufactured by Shin-Etsu Chemical Co., Ltd.) by using a vacuum film laminator (temperature, 100° C.; pressure, 100 Pa; TEAM-100 manufactured by Takatori Corporation). The wafer was then diced to squares of 2 mm×2 mm by using a dicing saw having a dicing blade (DAD685 manufactured by DISCO). A square chip of 2 mm×2 mm was placed on a separately prepared silicon wafer of 15 mm×15 mm (base substrate) with an intervening resin film and the laminate was heated at 150° C. with a load of 50 mN. The laminate was then heated to 180° C. for 2 hours to cure the resin film and prepare the test piece. 5 test pieces were produced for each type for use in the evaluation of the adhesion as described below.

The resistance when the semiconductor chip (2 mm×2 mm) was peeled off the base substrate (the silicon wafer square of 15 mm×15 mm) was measured by using a bond tester (Dage series 4000-PXY: manufactured by Dage) to thereby evaluate the adhesion of the resin film layer. The test was conducted at the test speed of 200 μm/sec and a test height of 50 μm. The results are shown in Table 2. The values shown in Table 2 are respectively an average of the values measured for the 5 test pieces, and a higher value indicates higher adhesion of the adhesive sheet.

[Evaluation 4: Reliability]

The wafer having a cured resin film was diced into test pieces of 10 mm×10 mm square by using a dicing saw having a dicing blade (DAD685 manufactured by DISCO) at a spindle rotation of 40,000 rpm and a dicing speed of 20 mm/sec. The resulting test pieces (10 for each type) were subjected to a heat cycle test (1,000 cycles of maintaining at −25° C. for 10 minutes and at 125° C. for 10 minutes), and the peeling of the resin film from the wafer after the heat cycle test was confirmed. The result was evaluated good when no peeling at all was found while the result was evaluated poor when peeling was found in one or more test piece. The results are shown in Table 2.

TABLE 2

| Evaluation | Example | | | | | | | | Comparative Example | | |
|---|---|---|---|---|---|---|---|---|---|---|---|
| | 1 | 2 | 3 | 4 | 5 | 6 | 7 | 8 | 1 | 2 | 3 |
| Warpage [mm] | up to 1 | up to 1 | up to 1 | up to 1 | up to 1 | up to 1 | up to 1 | up to 1 | up to 1 | up to 1 | 7 |
| Wafer supporting ability | Good | Good | Good | Good | Good | Good | Good | Good | Good | Poor | Good |
| Adhesion [MPa] | 28.4 | 31.0 | 30.1 | 29.2 | 29.3 | 28.8 | 28.5 | 28.4 | 11.0 | 27.3 | 19.8 |
| Reliability | Good | Good | Good | Good | Good | Good | Good | Good | Poor | Poor | Poor |

As demonstrated by the results, the resin composition of the present invention and the resin film produced by using this resin composition exhibits reduced wafer warpage, good wafer supporting ability, strong adhesion, and high reliability.

As described above, the resin composition of the present invention can be formed in the shape of a film, and therefore, it can be used for simultaneous molding of the wafer (wafer molding), and it exhibits good molding ability when used for a large diameter thin film wafer. The results also demonstrated reduced warpage, good wafer protection, strong adhesion, and high reliability.

The present invention is not limited to the embodiments as described above which are described by way of illustration. Any embodiment having the constitution substantially the same as the technical idea described in the claims and exhibiting the action and effects similar to the technical idea described in the claims are within the technical scope of the present invention.

Japanese Patent Application No. 2011-243359 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resin composition comprising the following components (A), (B), and (C):

(A) a silicone resin containing repeating units represented by the following formulae (1-1), (1-2), and (1-3) and having a weight average molecular weight as measured by GPC in terms of polystyrene using tetrahydrofuran for elution solvent of 3,000 to 500,000,

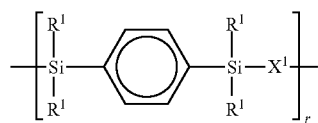
(1-1)

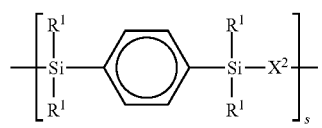
(1-2)

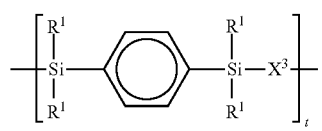
(1-3)

wherein r, s, and t are independently a positive integer; the silicon atom at the terminal of the units constituting the repeating units represented by the formulae (1-1), (1-2), and (1-3) is bonded to the terminal carbon atom of the $X^1$, $X^2$, or $X^3$ in the same or different unit; $R^1$ is independently a monovalent hydrocarbon group containing 1 to 8 carbon atoms; $X^1$ is independently a divalent group represented by the following formula (2):

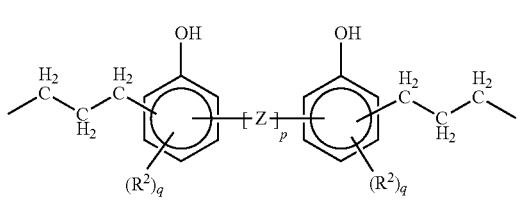
(2)

wherein Z is a substituted or unsubstituted divalent hydrocarbon group containing 1 to 15 carbon atoms, and p is 0 or 1, $R^2$ is independently an alkyl group or an alkoxy group containing 1 to 4 carbon atoms, and q is 0, 1, or 2; $X^2$ is independently a divalent group represented by the following formula (3):

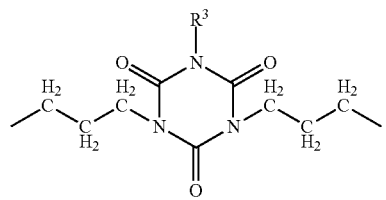
(3)

wherein $R^3$ is hydrogen atom, monovalent hydrocarbon group containing 1 to 8 carbon atoms, or a glycidyl group; and $X^3$ is independently a divalent group represented by the formula (4):

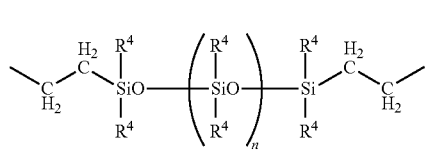
(4)

wherein $R^4$ is independently a monovalent hydrocarbon group containing 1 to 8 carbon atoms, and n an integer of 0 to 100;

(B) a thermosetting resin; and (C) a filler.

2. A resin composition according to claim 1 wherein Z in the formula (2) is a group selected from

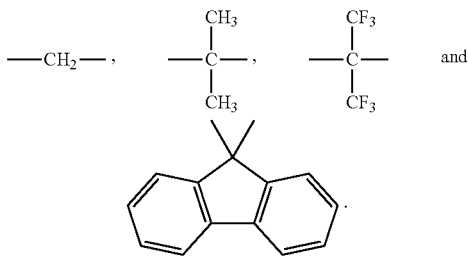

3. A resin composition according to claim 1 wherein the component (A) further comprises at least one unit selected from the unit represented by the following formula (5), the unit represented by the following formula (6), and the unit represented by the following formula (7):

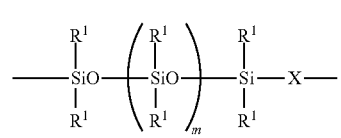
(5)

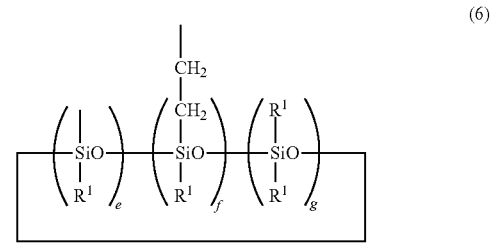
(6)

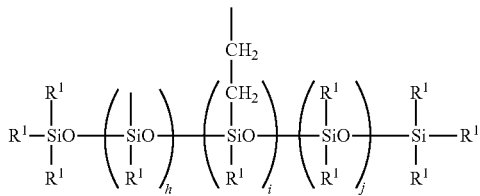

(7)

wherein $R^1$ is independently a monovalent hydrocarbon group containing 1 to 8 carbon atoms, m is an integer of 0 to 100; e, f, g, h, i and j are an integer of 0 to 100 with the proviso that e+f+g≥3, e and f are not simultaneously 0, h and i are not simultaneously 0; X is independently a group represented by the $X^1$, $X^2$, or $X^3$; and the silicon atom at the terminal of the units constituting the repeating unit represented by the formulae (1-1), (1-2), and (1-3) and the units represented by the formulae (5), (6) and (7) is bonded to the terminal carbon atom of the same or different units.

4. A resin composition according to claim 1 wherein the amount of the component (B) is 5 to 100 parts by weight in relation to 100 parts by weight of the component (A), and the weight ratio of the component (C) in relation to the entire weight is 30 to 85% by weight.

5. A resin composition according to claim 1 wherein the thermosetting resin is an epoxy resin.

6. A resin composition according to claim 5 further comprising at least one member selected from epoxy resin curing agents and epoxy resin curing accelerators.

7. A resin composition according to claim 1 wherein the filler is a silica.

8. A resin film prepared by using the resin composition of claim 1.

9. A method for producing a semiconductor device comprising the steps of attaching the resin composition or the resin film of claim 1 to a semiconductor wafer to mold the semiconductor wafer, and singulating the molded semiconductor wafer.

10. A semiconductor device having a heat cured film, which is produced by singulating a semiconductor wafer molded with a heat cured film prepared by heat curing the resin composition or the resin film of claim 1.

* * * * *